United States Patent [19]

(12) United States Patent
Bijkerk et al.

(10) Patent No.: US 7,261,957 B2
(45) Date of Patent: Aug. 28, 2007

(54) MULTILAYER SYSTEM WITH PROTECTING LAYER SYSTEM AND PRODUCTION METHOD

(75) Inventors: Frederik Bijkerk, Amsterdam (NL); Eric Louis, Ijsselstein (NL); Andrey E. Yakshin, Nieuwegein (NL); Peter Cornelis Görts, Utrecht (NL); Sebastian Oestreich, München (DE); Lambertus Gerhardus Albertus Michael Alink, Eindhoven (NL); Jan Verhoeven, Kockengen (NL); Robbert Wilhelmus Elisabeth van de Kruijs, Geldrop (NL)

(73) Assignee: Carl Zeiss SMT AG (DE)

( * ) Notice: Subject to any disclaimer, the term of this patent is extended or adjusted under 35 U.S.C. 154(b) by 256 days.

(21) Appl. No.: 10/706,826

(22) Filed: Nov. 12, 2003

(65) Prior Publication Data

US 2004/0121134 A1 Jun. 24, 2004

Related U.S. Application Data

(63) Continuation-in-part of application No. 09/821,448, filed on Mar. 29, 2001, now Pat. No. 6,656,575.

(30) Foreign Application Priority Data

Mar. 31, 2000 (DE) ................. 100 16 008

(51) Int. Cl.
*B32B 9/00* (2006.01)
*F21V 9/06* (2006.01)
(52) U.S. Cl. ............. 428/701; 428/450; 428/641; 250/505.1; 359/359; 359/361

(58) Field of Classification Search ............... 428/212, 428/408, 698, 472, 469, 701, 641, 450; 250/505, 250/505.1; 359/359, 360, 361
See application file for complete search history.

(56) References Cited

U.S. PATENT DOCUMENTS

| 4,693,933 | A | 9/1987 | Keem et al. |
|---|---|---|---|
| 5,052,033 | A | 9/1991 | Ikeda et al. |
| 5,265,143 | A | 11/1993 | Early et al. |
| 5,310,603 | A | 5/1994 | Fukuda et al. |
| 5,433,988 | A | 7/1995 | Fukuda et al. |
| 5,760,981 | A | 6/1998 | Gillich |
| 5,958,605 | A | 9/1999 | Montcalm et al. |
| 6,160,867 | A | 12/2000 | Murakami |
| 6,449,086 | B1* | 9/2002 | Singh ............... 359/361 |
| 6,759,141 | B2* | 7/2004 | Prisbrey ............ 428/635 |
| 6,780,496 | B2 | 8/2004 | Bajt et al. |
| 2002/0084425 | A1* | 7/2002 | Klebanoff et al. ...... 250/492.1 |

FOREIGN PATENT DOCUMENTS

| EP | 1 065 568 A2 | 1/2001 |
|---|---|---|
| JP | 5-203798 | 8/1993 |
| JP | 06273596 | 9/1994 |
| JP | 08122496 | 5/1996 |
| WO | WO93/09545 | 5/1993 |
| WO | WO99/24851 | 5/1999 |
| WO | WO 03/081187 A2 | 10/2003 |

OTHER PUBLICATIONS

J.H. Underwood et al., *Tarnishing of Mo/Si multilayer x-ray mirrors*, Applied Optics, vol. 32, 1993, p. 6985-6990.
C. Montcalm et al., *Multilayer reflective coatings for extreme-ultraviolet lithography*, SPIE, vol. 3331, (1998) p. 42-51.
M. Cilia et al., *Ni/Si based multilayer for the reflection of soft x rays in the "water window"*, J. Appl-Phys., 82 (9), 1997, p. 4137-4142.
H. Takenaka et al, *Design and fabrication of highly heat-resistant Mo/Si multilayer soft X-ray mirrors with interleaved barrier layers*, J. Synchrotron Rad. (1998) 5. p. 708-710.
E.J. Puik et al., *Ion bombardment of X-ray multilayer coatings: comparison of ion etching and ion assisted deposition*, Applied Surface Science 47 (1991) p. 251-260.

* cited by examiner

*Primary Examiner*—G. Blackwell
(74) *Attorney, Agent, or Firm*—Hudak, Shunk & Farine Co. LPA

(57) ABSTRACT

A multilayer system and its production. Multilayer systems, such as those used as mirrors in the extreme ultraviolet wavelength range, suffer contamination or oxidation during storage in air and in long-time operation, i.e. when exposed to EUV radiation in a vacuum environment with certain partial pressures of water or oxygen, which causes a serious reduction in reflectivity. The multilayer system according to the invention will have a long life with constantly high reflectivity. Their reflectivity can be enhanced by barrier layers. The multilayer systems according to the invention have protective layers comprising iridium. The multilayer systems according to the invention are produced by direct, ion-beam-supported growth of the respective layer. The multilayer systems according to the invention are not only resistant to contamination and oxidation, but can also be cleaned if necessary, without losing reflectivity. Because of their long life with constantly high reflectivity, they are particularly suitable for use in semiconductor lithography in the soft X-ray range or extreme ultraviolet wavelength range.

6 Claims, 1 Drawing Sheet

MULTILAYER SYSTEM WITH PROTECTING LAYER SYSTEM AND PRODUCTION METHOD

CROSS REFERENCE

This patent application is a continuation-in-part application based on U.S. application Ser. No. 09/821,448 filed Mar. 29, 2001 now U.S. Pat. No. 6,656,575, herein fully incorporated by reference, which in turn claims priority from German Application No. 100 16 008.5, filed Mar. 31, 2000.

FIELD OF THE INVENTION

The invention relates to multilayer reflective systems with a protective capping layer system. The invention also relates to the production method of such multilayer systems and of multilayer systems with barrier layers.

BACKGROUND OF THE INVENTION

Conventional multilayer systems are produced by depositing materials with different refractive indices or different absorption coefficients on top of each other in several layers on a substrate. They are used in particular as mirrors in the extreme ultraviolet range. The wavelength range between 10 nm and 50 nm is designated as the extreme ultraviolet wavelength range. Other possible applications of multilayer systems are for example, in the visible wavelength range, as antireflective coatings of optical elements.

The reflection of electromagnetic radiation on a multilayer system is based on interference between the radiation which is reflected on the many interfaces of the multilayer system and is approximated by Bragg's law. This reflection is thus of a dispersive nature. The reflectivity of the interface between two such layers for electromagnetic radiation in a wavelength range<50 nm amounts to a few per thousand for angles that are greater than the critical angle. For reflection angles greater than the critical angle reflectivities up to a magnitude of 70% can be obtained. Multilayer systems are therefore used to achieve high reflectivities with maximum angles relative to the layer surface, and can also be used as dispersive elements.

A multilayer system for reflecting short wavelengths consists of successive sets of two or more layers respectively of materials with different refractive indices and thicknesses, for example in the magnitude of the wavelength of the reflected radiation. Partial reflection takes place at each of the interfaces between the different materials, and with a proper choice of the individual layer thicknesses, all partial reflections add up coherently. The overall reflectivity of a multilayer system is determined by the magnitude of the reflection per boundary surface, i.e. the difference of the refractive indices.

Multilayer systems for the extreme ultraviolet wavelength range generally consist of molybdenum-silicon- or molybdenum-beryllium-systems. For special applications multilayer systems are used made up from more than two differing types of layers. The choice of material with all multilayer systems depends heavily on the application's wavelength range.

Multilayer systems are utilized for the extreme ultraviolet to soft x-ray wavelength range amongst other things in lithography for the production of semiconductor components. It is precisely in their being employed in lithography that the multilayer system needs to demonstrate a long life with maximum possible constant reflectivity. On the one hand, the mirrors must show as little radiation damage as possible despite long periods of radiation. Any contamination or radiation damage would result in a shortened lifetime and usage interval, and hence in increased cost of the lithography process. The reflectivity may fluctuate, but would reduce on the long term.

Examinations have shown that when kept in air reflectivity decreases with time. Molybdenum silicon multilayer mirrors were examined. In particular, molybdenum used as the outermost layer became completely oxidized to molybdenum trioxide and molybdenum dioxide and contaminated with carbon-containing compounds, so that the absolute reflectivity decreased by 10 to 12%. The oxidization of the silicon layer into silicon dioxide caused a decrease in reflectivity of 4 to 5%.

In order to counter this it has been proposed that the mirrors should be provided with a protective layer of carbon of a thickness of 0.5 to 1 nm. With such mirrors we are dealing with a multilayer system for the soft x-ray range to the extreme ultraviolet wavelength range. For layering materials here use is made of, for example, ruthenium and silicon dioxide or even silicon carbide and hafnium.

In addition, to minimize the problem of reduction of reflectivity by oxidization and contamination of the uppermost layer, theoretical simulations were carried out for protective layers made from silicon dioxide, boron carbide, boron nitride, carbon, palladium, molybdenum carbide and molybdenum boride.

Moreover, it has been tested experimentally, how the reflectivity of multilayer systems changes when used in the context of lithography with extreme ultraviolet wavelengths. Measurements were carried out over a long period in real working conditions. In the course of this it was discovered that reflectivity is greatly decreased by contamination of the multilayer systems through residual substances in a vacuum.

A two or more layer passivation for multilayer reflectors for the soft x-ray and extreme ultraviolet wavelength range has already been described. The passivation consists at least of an under coating and an upper coating. In the case of the under coating it is a matter of the less absorbent material of the multilayer reflector, i.e. silicon in the case of molybdenum silicon mirrors, and beryllium in the case of molybdenum beryllium mirrors. In the case of the upper coating it is a matter of a material that does not oxidize or form an oxidation barrier and protects the layers beneath from oxidization. Quite generally these can be pure elements, carbides, oxides or nitrides. For example, silicon carbide, silicon dioxide or even molybdenum carbide are especially proposed. The thicknesses of the protective layers vary within the range of ca. 0.5 to 5 nm and are especially optimized on the mirrors to be protected. The upper coating is applied by precipitation from the gas phase or even controlled oxidization, the process for controlled oxidization not being elaborated in greater detail.

Another aspect is the optimization of the reflectivity. Theoretically a Mo/Si system can reflect up to 75% at near normal incidence at 13.5 nm. In practice, this reflectivity can not be achieved due to different imperfections in layer manufacturing. One of the severe limitations causing several percents drop in reflectance is imposed by formation of interlayers at Mo-on-Si and Si-on-Mo boundaries during the multilayer deposition. This reflectance drops further after subjecting the system to elevated temperatures, causing materials interdiffusion. The reflectivity drop is determined by the thickness of the interlayers formed, which initially (after deposition) ranges from around 0.8 to 1.5 nm depending on the deposition method. During annealing, the interlayer can only grow.

The forming of interlayers is a problem not only of Mo/Si multilayer systems, but of multilayer systems in general. One of the ways to prevent formation of these thick interlayers is to introduce additional layers between Mo and Si that can act as diffusion barriers.

A method for producing silicon nitride and nickel silicide layers in Ni/Si based multilayers has been described. Silicon nitride was formed by growing 3 nm Si, followed by the removal of 1 nm Si by 300 eV $N^+$ ions. The next step was the deposition of a layer pair of 1 nm nickel and 2 nm silicon on the top. From the silicon layer 1 nm was removed by 300 eV $Ne^+$ ions to produce a nickel silicide layer.

By investigating the influence of ion assisted deposition on the reflectivity of Ni/C multilayers, it has been found that the reflectivity was significantly enhanced compared with Ni/C multilayers deposited without ion beam assistance. An even stronger enhancement was obtained by ion etching every layer after deposition (without ion beam assistance) to smoothen the surface.

SUMMARY OF THE INVENTION

The object of the present invention is to prepare multilayer systems, especially for the extreme ultraviolet wavelength range, with a longer life span with as constant and high a reflectivity as possible.

This object is achieved by a multilayer system with a protective layer system comprising iridium. Moreover, the task is met by a processes for the production of multilayer systems with protective layer systems or barrier layers based on ion beam assisted deposition.

DETAILED DESCRIPTION OF THE INVENTION

Figure 1:
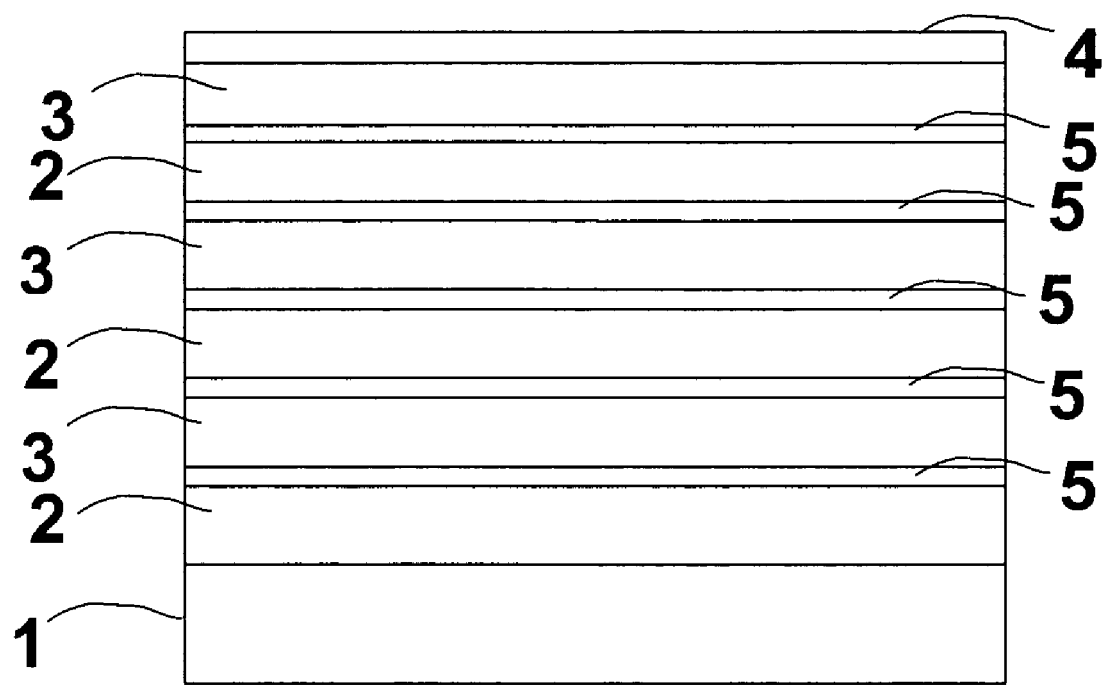
FIG. 1 is a cross-sectional view of a multi-layer system according to the present invention.

The multilayer system according to the invention can consist of two or more materials with differing refractive indices or absorption coefficients. By applying a protective layer system of at least one of the substances ruthenium, iridium, rhodium, silicon nitride, aluminium oxide, titanium nitride, carbon, molybdenum carbide, silicon carbide or titanium dioxide respectively a situation is achieved where not only are the mirrors passivated against radiation damage, and chemical and mechanical influences, but the reflectivity is also even increased to a small extent. In contrast with conventional multilayer systems without a protective layer, the life span is increased e.g. by a factor of three.

The multilayer systems according to the invention have the advantage that they can be cleaned, without suffering any losses in reflectivity. Here various options for cleaning methods may be employed, whether it be for example ozone cleaning or wet or dry chemical etching.

Moreover, the multilayer systems according to the invention shows the positive characteristic, compared with the multilayer systems of the prior art, of increased insensitivity to the partial pressure of water and/or water containing components, which are to be found during use of the multilayer system in a vacuum chamber. This results in the risk from oxidation by water being lessened.

The most important advantage of the multilayer systems according to the invention is an improved resistivity against oxidation and contamination.

Ruthenium is an inert material which is resistant to surface deterioration caused, for example, by oxidation. In optical applications it has hitherto been used as a layer with a small refractive index in multilayer systems. In particular for synchrotron radiation, multilayer systems made from ruthenium and, for example, silicon oxide are used, as the thermal load is especially great with synchrotron radiation, which can damage other multilayer systems more rapidly. In addition, ruthenium is also used as a chemically inert interface between the substrate and the actual multilayer system.

Iridium is one of the most dense and hard materials and shows a very strong resistance to corrosion. It is normally used as alloy with platinum.

Rhodium is almost as hard as iridium and shows as strong a resistance to corrosion. Rhodium is mainly used in catalysts, thermoelements and for plating.

Silicon nitride is known for its very high hardness and heat conductivity. Hydrofluoric acid is the only acid to dissolve silicon nitride. The coefficient of expansion is very low.

Aluminium oxide, also known as alumina, occurs in various modified forms. Aluminium oxide in the form of corundum is used on account of its hardness as bearing stones in clocks or electrical measuring instruments as well as an abrasive for gemstones and metals. Ceramic substances are produced from aluminium oxide. Other applications are adsorbents in adsorption chromatography and also catalysts.

Titanium nitride serves as the main material for the production of hardening and anti-wear protective surface coatings on precision machine bearings, roller bearings, cutting tools and the like, for lining reaction containers, especially for liquid metals such as aluminium, copper and iron and for the coating of clock housings and jewelry. Thin coatings of titanium nitride can be created, for example, by gas phase precipitation.

Titanium dioxide is distinguished by a very high refractive index. It has a particular technical significance as an excellent white pigment. Titanium dioxide white pigments are used for whitening or brightening of colourful pigments. In chemistry, titanium dioxide also serves as a medium for catalysts.

Carbon is known to possess suitable properties as one of the materials in multilayer systems in the sense that it grows as an amorphous, dense layer with low chemical reactivity. In addition, it has suitable optical properties in the EUV and x-ray wavelength range.

All the coating materials have in common that they are used to passivate the surface of the multilayer system.

In a preferred embodiment only the protective layers of the multilayer system comprise or are made up respectively of ruthenium, aluminium oxide, iridium, rhodium, titanium nitride, carbon, silicon nitride, silicon carbide, molybdenum carbide or titanium dioxide.

In a preferred embodiment the protective layer system consists of carbon covered by iridium, silicon carbide covered by iridium, molybdenum carbide covered by iridium, aluminium oxide covered by iridium, titanium nitride covered by iridium, or titanium dioxide covered by iridium.

For special applications it can be an advantage if there is added to the protective coating along with iridium, a further substance, which can form not only a mixture but also an alloy or a compound with the iridium. A mixture of silicon nitride with a further substance is advantageous, too.

In a different aspect of the invention the multilayer system shows implanted carbon at the interface between two alternating layers. Preferably, the alternating layers are made from silicon and molybdenum for use as reflective multilayer for the extreme ultraviolet wavelength range (EUV), e.g. in lithography. The optical properties of carbon in the EUV range are similar to those of silicon. By implanting carbon silicon carbide is supposed partly to form, preventing the forming of an silicon-molybdenum interlayer. The implanted carbon has the further advantage to enhance the thermal stability of the multilayer system.

The method for the production of a multilayer system for the extreme ultraviolet wavelength range, made from alternating layers of materials with different refractive indices or absorption coefficients with a protective layer system, comprising one or several layers, is characterized in that the protective layer systems layers are applied directly to the outermost layer of the multilayer system and that some or all are produced using ion beam treatment during their fabrication.

Every physical vapour deposition method can be used, preferably electron beam evaporation, and magnetron sputtering.

Multilayer systems for the extreme ultraviolet range can be produced by applying a protective layer consisting of at least ruthenium, at least rhodium, at least iridium, at least aluminium oxide, at least titanium nitride, at least silicon carbide, at least silicon nitride, at least molybdenum carbide, at least titanium dioxide or at least carbon directly onto the outer layer of the multilayer system with the help of an ion beam during deposition of one or all of the uppermost layers. The already known protective layer of silicon carbide can also be produced by this method with good results.

The ion beam treatment can be simultaneous with deposition as for ion beam assisted deposition (IABD). The just deposited layer can also be exposed to an ion beam as for implanting, etching or polishing the layer surface. Different ion beam treatments can be combined, when producing a layer.

Similarly, multilayer systems with barrier layers or with barrier layers and protective layer systems are advantageously produced by depositing at least the barrier layer using ion beam treatment. Preferably, the barrier layer and the protective layer system are deposited using ion beam treatment. Barrier layers have the advantage of enhancing the thermal stability of the multilayer system and in some cases increasing reflectivity.

Ion irradiation during thin film growth is an effective means of controlling the structure and the composition of the thin film.

The use of one or more inert gases for the ion beam has proved especially successful. An ion beam containing Ar, Kr, Ne, He, oxygen, hydrogen, carbon or nitrogen is preferred. Especially for the deposition of barrier layers and protective layers it is preferred to use nitrogen or a mixture of nitrogen and an inert gas or a mixture of $CH_4$ and an inert gas or a mixture of hydrogen and an inert gas.

In a preferred embodiment, to form the protective layer, carbon is introduced into a silicon or molybdenum layer, or oxygen into an aluminium or titanium layer, or nitrogen into a titanium or silicon layer, wherein the layer is polished with a carbon-, oxygen-, or nitrogen-containing ion beam. The silicon layer can be the topmost layer in the multilayer system. Methane ions can for example be used for a carbon-containing ion beam. On the one hand, carbon, oxygen or nitrogen are incorporated into the silicon, molybdenum, titanium or aluminium layer by an appropriate ion beam, so that an interface made from SiC, $Si_3N_4$, $Al_2O_3$, $Mo_2C$, $TiO_2$ or TiN is formed. On the other hand the surface of the outermost layer is smoothened by the energy input of the ion beam.

In another preferred possible method for producing a multilayer system with a protective layer of at least aluminium oxide, titanium dioxide, titanium nitride or silicon carbide, one applies a thin layer of the metal of atomic thickness to the topmost layer of the multilayer system. Then the metal is oxidized or nitridized or carbonized, i.e. converted to a state of e.g. aluminium oxide or titanium nitride or silicon carbide, by applying low-energy oxygen or nitrogen or carbon ions. The formation of these chemical compounds can take place during or just after the growth of the single metal films.

Both methods may be applied for depositing barrier layers as well.

Depending on how the ion beam is chosen or whether, in addition to the carbon, oxygen or nitrogen, layers of further substances are also applied, either a pure silicon carbide, silicon nitride, aluminium oxide, molybdenum carbide, titanium dioxide or titanium nitride layer is formed, or a silicon carbide-, molybdenum carbide-, aluminium oxide-, titanium dioxide- or titanium nitride-containing protective layer.

One advantage that emerges generally from the treatment of a layer with ion beams is that the surface roughness is diminished, which increases the reflectivity of the multilayer system. The most important influence, however, is an improvement of the environmentally protective properties of the layer, due to the layer densification and the improvement of the layer morphology. In case of barrier layers this leads to an enhanced thermal stability of the multilayer system. By this means to a certain extent the reflectivity can be influenced.

The thickness of the layer can equally be adjusted by the surface treatment by means of an ion beam.

It has proved to be of advantage for the ion beam to use either one or several inert gases or ion beams which contain Ar, Kr, oxygen or nitrogen. In the latter case, the protective layer can be produced by first of all applying e.g. aluminium or titanium and there forming a corresponding protective layer of e.g. aluminium dioxide, titanium nitride or titanium dioxide through a deposit with input of oxygen or nitrogen from the ion beam.

In a special aspect of the invention after deposition of a protective layer system comprising at least a carbon layer deposited with ion beam treatment, it is exposed to EUV radiation, to electron beam, or to elevated temperatures.

In a preferred embodiment the exposures are done in the environment of gases containing oxygen.

In a preferred embodiment at least one of the alternating layers is deposited at least partly with ion beam assistance. Most preferably this is done for starting and/or finishing the respective material's deposition. The ion beam's energy input smoothens the surface layer and densifies the layer, thus improving the layer morphology. This results e.g. in enhanced reflectivity of the multilayer system. When depositing a layer with ion beam assistance, advantageously an ion beam with ion energies in the range of about 5 to 1500 eV, preferably 5 to 300 eV is used.

In another special aspect of the invention one or more alternating layers are exposed to an ion beam after deposition. The ion beam is generated by an ion source using nitrogen or a mixture of nitrogen and an inert gas or a mixture of hydrogen and an inert gas or, preferably, a mixture of $CH_4$ and an inert gas for implanting material into the multilayer for enhancing its overall stability. In the latter case, carbon is implanted in the exposed layer. Suitable energies are in the range of about 10 eV to 1.5 keV with a preference for about 30 eV to 150 eV, if the ion beam treatment leads predominantly to intermixing, and a preference for about 100 eV to 1.5 keV, if the ion beam leads predominantly to implanting. Preferably, silicon and molybdenum are used as material for the alternating layers, most preferably carbon being implanted into silicon.

The advantages of the invention are made clear by the following examples and comparative examples based on molybdenum-silicon multilayer systems. The person skilled in the art will understand that the principles underlying the examples may be applied as well to multilayer systems based on other materials like e.g. molybdenum and beryllium.

The general structure of a multilayer system as described in the examples is sketched in FIG. 1. On a substrate 1 are deposited alternating layers of e.g. molybdenum 2 and silicon 3. On top of the alternating layers 2, 3 may be a protective layer 4. Between two alternating layers 2, 3 may be a barrier layer 5.

EXAMPLE 1

A multilayer system consisting of basic, 4-layer stacks of $Mo/Mo_2C/Si/SiC$ is produced where $Mo_2C$ and SiC are barrier layers. Deposition of a period starts with Mo evaporation. When a predetermined thickness of Mo is reached, an ion beam is switched on and the growth continues with ion assistance. A process gas mixture of $CH_4$ and Kr or another inert gas is used in the ion source to create a carbon containing ion beam to form the $Mo_2C$ interlayer after impact of the ions with the top layer of the multilayer. When a predetermined $Mo_2C$ thickness is reached, deposition stops and the ion beam is shut down. The process continues with evaporation of Si. When a predetermined thickness of Si is reached, the ion beam is switched on and the growth continues with ion assistance using the same process gas mixture as for $Mo_2C$ to create a SiC interlayer. When a predetermined SiC thickness is reached, the deposition stops and the ion beam is stopped. The process described is repeated 50 times to obtain a 50 period stack, or 200 layers in total. The topmost SiC layer plays the role of a protective layer.

EXAMPLE 2

A Mo/C/Si/C multilayer is produced where C is a barrier layer. Deposition of a period starts with Mo evaporation. When a predetermined thickness of Mo is reached, deposition stops. The surface is exposed to an ion beam for a predetermined period of time. A process gas mixture of $CH_4$ and Kr or another inert gas is used in the ion source to create a carbon containing ion beam to form a C interlayer. Its thickness is determined by time. The process continues with evaporation of Si. When a predetermined thickness of Si is reached, deposition stops. The surface is exposed to the ion beam for a predetermined period of time. The same process gas mixture of $CH_4$ and an inert gas is used again to form a C interlayer. The described process is repeated 50 times to obtain a 50 period stack, or 200 layers in total. The topmost carbon layer plays the role of a protective layer.

EXAMPLE 3

A $Mo/Si_3N_4/Si/Si_3N_4$ system is produced where $Si_3N_4$ is a barrier layer. Deposition of a period starts with Mo evaporation. When a predetermined thickness of Mo is reached, deposition stops. The $N^+$ ion beam is switched on with ions with an energy of ca. 50 eV. For this, $N_2$ gas is used in the ion source. Simultaneously, evaporation of Si starts. This deposition with ion assistance continues until a $Si_3N_4$ layer of predetermined thickness is formed. The ion beam is shut down and evaporation of Si continues without ion assistance. When a predetermined thickness of Si is reached, deposition stops. The ion beam is switched on again and the surface is exposed to $N^+$ ions with an energy of ca. 50 eV, for a predetermined period of time, to create a self-terminated monolayer of $Si_3N_4$. The described process is repeated 50 times to obtain a 50 period stack, or 200 layers in total. The topmost $Si_3N_4$ layer plays the role of a protective layer.

EXAMPLE 4

A multilayer based on alternating layers made of silicon and molybdenum with a periodicity of 6.3 nm is produced by electron beam evaporation and ion beam treatment. The electron beam deposition chamber is equipped with a Kaufman source that is mounted under an angle of 45° with the substrate surface. To obtain a stable ion beam discharge a gas mixture of 50% methane and 50% neon is fed to the Kaufman source. To prevent charging of the substrate, the ion beam is neutralized by intermixing with electrons emitted from a separate filament. The working pressure is ca. $1 \times 10^{-7}$ mbar. Every silicon layer is subsequently exposed to a methane ion beam with an energy of around 500 eV for implantation of carbon.

EXAMPLE 5

101 layers, with a thickness of 2.6 nm or 4 nm, of molybdenum and silicon respectively, are vapour-deposited onto a silicon substrate. The topmost layer is a silicon layer. A 1.5 nm-thick carbon layer is vapour-deposited on top of this. With an krypton ion beam, at the same time the carbon and the silicon layer at its interface are mixed to form a 1 nm-thick silicon carbide layer, and at the same time the surplus carbon is removed, and the silicon carbide surface polished to a roughness of less than 0.25 nm. With a wavelength of 13.2 nm, the reflectivity amounts to 70% both after production and also 200 days later when kept in air.

EXAMPLE 6

101 layers, with a thickness of 2.6 nm or 4 nm, of molybdenum and silicon respectively, are vapour-deposited onto a silicon substrate. The topmost layer is a silicon layer. A 1.5 nm-thick aluminium oxide layer is vapour-deposited on top of this. With an krypton ion beam, at the same time the protective layer on its surface is polished to a roughness of less than 0.25 nm. With a wavelength of 13.2 nm, the reflectivity amounts to 70% both after production and also 200 days later when kept in air.

EXAMPLE 7

101 layers, with a thickness of 2.6 nm or 4 nm, of molybdenum and silicon respectively, are vapour-deposited onto a silicon substrate. The topmost layer is a silicon layer. Supported by a nitrogen ion beam, titanium is vapour-deposited onto this, so that a 1.2 nm-thick titanium nitride layer is formed. With the ion beam, at the same time the protective layer on its surface is polished to a roughness of less than 0.25 nm. With a wavelength of 12.9 nm, the reflectivity amounts to 68% both after production and also 200 days later when kept in air.

EXAMPLE 8

101 layers, with a thickness of 2.6 nm or 4 nm, of molybdenum and silicon respectively, are vapour-deposited onto a silicon substrate. The topmost layer is a silicon or molybdenum layer. Supported by an ion beam, a 1 nm-thick ruthenium layer is applied onto this. The energy input of the ion beam leads to a densification of the ruthenium layer and a smoothing of the surface of the ruthenium layer to a roughness of less than 0.25 nm. With a wavelength of 13.0 nm, the reflectivity amounts to 69.5% after exposure to EUV radiation in a vacuum environment for several hours.

EXAMPLE 9

A total of 101 layers of molybdenum and silicon of respectively 2.6 and 4 nm, were deposited onto a silicon substrate. The topmost layer is a silicon layer. Then, a thin, 2 nm thick carbon layer is deposited under simultaneous use of an ion beam applied to the layer being grown. The energy provided by the ion beam leads to a dense and closed carbon layer of a favourable atomic structure, that makes it resistant to oxidation in an oxygen or water containing environment, e.g. at a partial pressure of $10^{-6}$ mbar. For a wavelength of 13.5 nm, the reflectivity amounts 68.0%, both just after production of the multilayer system, as well as after exposure of the multilayer system to EUV radiation on a vacuum environment with certain partial pressures of water or oxygen. The carbon layer, when produced with the additional use of an ion beam during growth, has made the multilayer system resistant against degradation or contamination under EUV exposure.

EXAMPLE 10

The multilayer system of example 9 is kept in a vacuum environment with a controlled background pressure of oxygen during exposure to EUV radiation. The reflectivity of the multilayer system does not degrade during exposure suggesting a balancing of contamination and in-situ cleaning processes.

EXAMPLE 11

A total of 101 layer of molybdenum and silicon of respectively 2.6 and 4 nm were deposited onto a silicon substrate. The topmost layer is a silicon layer. Then, a thin, 2 nm thick carbon layer is deposited under simultaneous use of an ion beam. After that, the surface is exposed to EUV radiation of 13.5 nm for several hours in vacuum with partial pressure of water at $10^{-6}$ mbar and partial pressure of oxygen of $10^{-4}$ mbar. Oxygen will diffuse in the carbon and silicon layers, react with these resulting in a passivation layer which is resistant to further oxidation under EUV radiation in an oxygen containing environment. For a wavelength of 13.5 nm, the reflectivity amounts to 68% after production of the multilayer system and may reduce or increase about 0.5% after the exposure to EUV after which it will stay constant under EUV radiation and when kept in air.

EXAMPLE 12

A total of 101 layer of molybdenum and silicon of respectively 2.6 and 4 nm were deposited onto a silicon substrate. The topmost layer is a silicon or molybdenum layer. Then two protective layers are deposited starting with a 2 nm carbon layer followed by 2 nm ruthenium layer. The carbon and ruthenium layers are deposited under simultaneous use of an ion beam. For a wavelength of 13.5 nm, the reflectivity amounts to 70% after production of the multilayer system and stays constant when kept in air and may change less than 0.5% (increases or decreases) under EUV radiation.

EXAMPLE 13

101 layers, with a thickness of 2.6 nm or 4 nm, of molybdenum and silicon respectively, are vapour-deposited onto a silicon substrate. The topmost layer is a silicon or molybdenum layer. Supported by an ion beam, a 1 nm-thick iridium layer is applied onto this. The energy input of the ion beam leads to a densification of the iridium layer and a smoothing of the surface of the iridium layer to a roughness of less than 0.25 nm. With a wavelength of 13.0 nm, the reflectivity amounts to 69.5% after exposure to EUV radiation in a vacuum environment for several hours.

EXAMPLE 14

A total of 101 layer of molybdenum and silicon of respectively 2.6 and 4 nm were deposited onto a silicon substrate. The topmost layer is a silicon or molybdenum layer. Then two protective layers are deposited starting with a 2 nm carbon layer followed by 2 nm rhodium layer. The carbon and rhodium layers are deposited under simultaneous use of an ion beam. For a wavelength of 13.5 nm, the reflectivity amounts to 70% after production of the multilayer system and stays constant when kept in air and may change less than 0.5% (increases or decreases) under EUV radiation.

EXAMPLE 15

A total of 101 layer of molybdenum and silicon of respectively 2.6 and 4 nm were deposited onto a silicon substrate. The topmost layer is a silicon or molybdenum layer. Then two protective layers are deposited starting with a 2 nm carbon layer followed by 2 nm iridium layer. The aluminium oxide and iridium are deposited under simultaneous use of an ion beam. For a wavelength of 13.5 nm, the reflectivity amounts to 69.5% after production of the multilayer system and stays constant when kept in air and may change less than 0.5% (increases or decreases) under EUV radiation.

EXAMPLE 16

101 layers, with a thickness of 2.6 nm or 4 nm, of molybdenum and silicon respectively, are vapour-deposited onto a silicon substrate. The topmost layer is a silicon layer. This top most silicon layer is polished by a nitrogen ion beam to form silicon nitride. Supported by a nitrogen ion beam, titanium is vapour-deposited onto this, so that a 1.2 nm-thick titanium nitride layer is formed. With the ion beam, at the same time the protective layer on its surface is polished to a roughness of less than 0.25 nm. With a wavelength of 13 nm, the reflectivity amounts to 68.2% both after production and also 200 days later when kept in air.

COMPARATIVE EXAMPLE

A molybdenum-silicon mirror made from 50 layer pairs consisting of 2.6 nm of Mo and 4 nm of Si and molybdenum as the outermost layer, immediately after production, before it comes into contact with air, has a reflectivity of 69% and after exposure to EUV radiation in a vacuum environment for several hours, a reflectivity of 55% with a wavelength of 13 nm in each case.

The foregoing description of preferred embodiments and examples is presented for purposes of illustration and description and is not intended to be exhaustive or to limit the invention to the precise form disclosed. Many modifications and variations are possible in light of the above teaching.

What is claimed is:

1. A multilayer system for the extreme ultraviolet wavelength range, comprising:

alternating layers of materials with different refractive indices or absorption coefficients, and a protective layer system having different material than said alternating layers and being disposed on top of said alternating layers, wherein the protective layer system is molybdenum carbide covered by iridium, aluminum oxide covered by iridium, titanium nitride covered by iridium, or titanium dioxide covered by iridium.

2. A multilayer system for the extreme ultraviolet wavelength range, comprising:

alternating layers of a) molybdenum and silicon or b) molybdenum and beryllium, and a protective layer system disposed on said alternating layers, wherein the protective layer system is molybdenum carbide covered by iridium, aluminum oxide covered by iridium, titanium nitride covered by iridium or titanium dioxide covered by iridium.

3. A multilayer system for the extreme ultraviolet wavelength range, comprising:

alternating layers of materials with different refractive indices or absorption coefficients, and at least one barrier layer between two of said alternating layers, wherein said at least one barrier layer is a $Mo_2C$ layer, and wherein a first layer of said alternating layers is a molybdenum layer and a second layer of said alternating layers is a beryllium layer.

4. A multilayer system for the extreme ultraviolet wavelength range, comprising:

alternating layers of materials with different refractive indices or absorption coefficients and at least one barrier layer between two of said alternating layers, wherein said at least one barrier layer is a $Si_3N_4$ layer.

5. The multilayer system according to claim 4, wherein said at least one barrier layer contains implanted nitrogen.

6. The multilayer system according to claim 4, wherein a first layer of said alternating layers is a molybdenum layer and a second layer of said alternating layers is a silicon layer.

* * * * *